United States Patent [19]

Katayama et al.

[11] Patent Number: 5,119,018
[45] Date of Patent: Jun. 2, 1992

[54] SPECTRUM ANALYZER HAVING FUNCTIONS FOR SIMULTANEOUSLY EXECUTING PLURAL KINDS OF DETECTIONS AND DISPLAYING RESULTANTS THEREOF

[75] Inventors: Aiichi Katayama, Isehara; Hiroyoshi Oka, Atsugi; Mitsuyoshi Takano, Machida, all of Japan

[73] Assignee: Anritsu Corporation, Tokyo, Japan

[21] Appl. No.: 455,943

[22] Filed: Dec. 22, 1989

[30] Foreign Application Priority Data

Jan. 10, 1989 [JP] Japan ..................................... 1-2132

[51] Int. Cl.⁵ ............................................. G01R 23/16
[52] U.S. Cl. ............................... 324/77 CS; 324/77 B; 324/121 R; 324/612; 340/720
[58] Field of Search ................ 324/77 B, 77 C, 77 CS, 324/77 R, 121 R, 619, 612, 613; 340/715, 720, 747; 128/633, 634, 664, 665

[56] References Cited

U.S. PATENT DOCUMENTS

| | | | |
|---|---|---|---|
| 2,570,139 | 10/1951 | Maxwell | 324/619 |
| 4,238,727 | 12/1980 | Madni | 324/77 CS X |
| 4,272,719 | 6/1981 | Niki et al. | 324/72 |
| 4,611,164 | 9/1986 | Mitsuyoshi et al. | 324/77 C X |
| 4,975,633 | 12/1990 | Toda et al. | 324/77 B |
| 5,025,208 | 6/1991 | Danzeisen | 324/77 R |

FOREIGN PATENT DOCUMENTS 3017327 11/1981 Fed. Rep. of Germany.
55-95877 7/1980 Japan.

OTHER PUBLICATIONS

IEEE Transactions on Broadcasting, vol. BC-22, No. 4, Dec./1976, pp. 116-123; R. A. Tell et al.: "Broadcast-Signal Bandwidth Measurements Using Real-Time Data Averaging", p. 117, right-hand column, last paragraph to p. 118, left-hand column, paragraph 1; FIGS. 3, 6.

R. Irwin: "Signal Detection and Post-Detection Signal/Display Processing Effects on Spectrum Analyzer Requirements", Apr./1981, pp. 1-30, Hewlett Packard, Signal Analysis Division, pp. 2, 3, 17-19.

New Electronics, vol. 19, No. 8, Apr./1986, pp. 53-56, London, GB, S. J. Gledhill: "Making a Spectrum Analyzer Easier to Use", p. 53, left-hand column, paragraph 2, FIG. 2.

Primary Examiner—Kenneth A. Wieder
Assistant Examiner—Glenn W. Brown
Attorney, Agent, or Firm—Frishauf, Holtz, Goodman & Woodward

[57] ABSTRACT

A frequency conversion section sweeps an object signal within a desired measurement frequency range, thereby frequency-converting the object signal. A peak detector detects a peak of an output from the frequency converting section. A measurement detector measures and detects the output from the frequency conversion section simultaneously with the peak detection by the peak detector. The measurement detector has an output characteristic lower than an output characteristic of the peak detector. A display displays an output from the peak detector and an output from the measurement detector on a single display screen, in synchronism with the sweeping by the frequency conversion section, with these outputs of the peak detector and the measurement detector being plotted along an axis representative of frequencies. In another mode of the invention, an alarm device indicates the fact that an output from the peak detector has exceeded a predetermined allowable limit level.

12 Claims, 9 Drawing Sheets

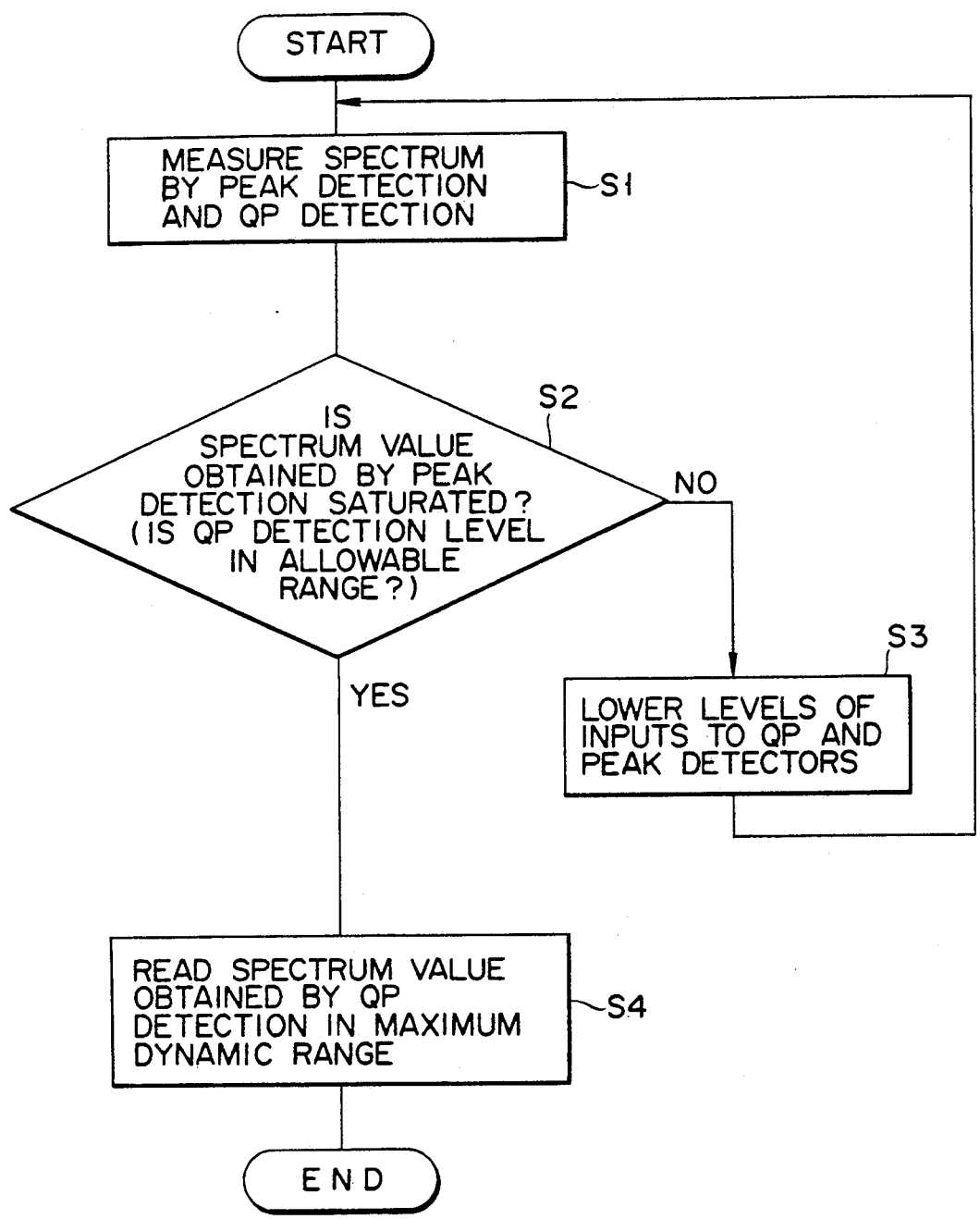
F I G. 1B

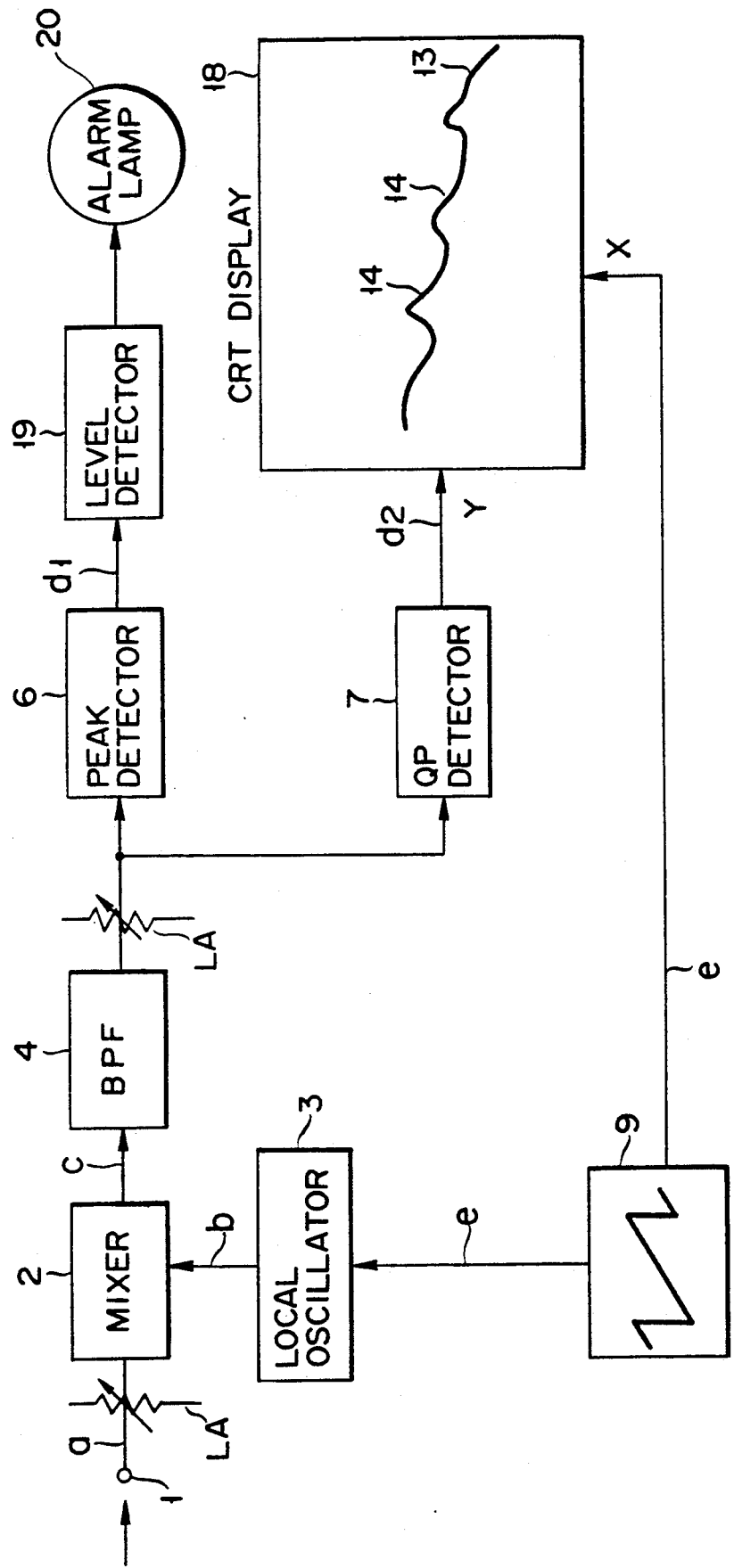
F I G. 3

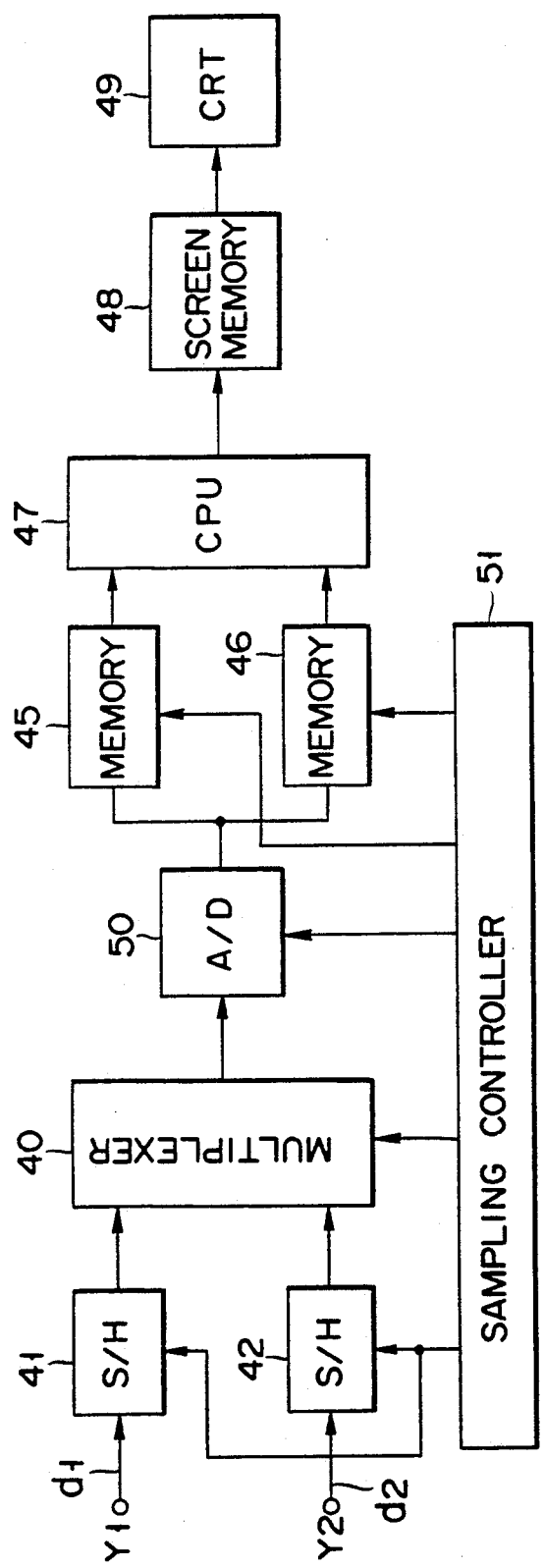
F I G. 4B

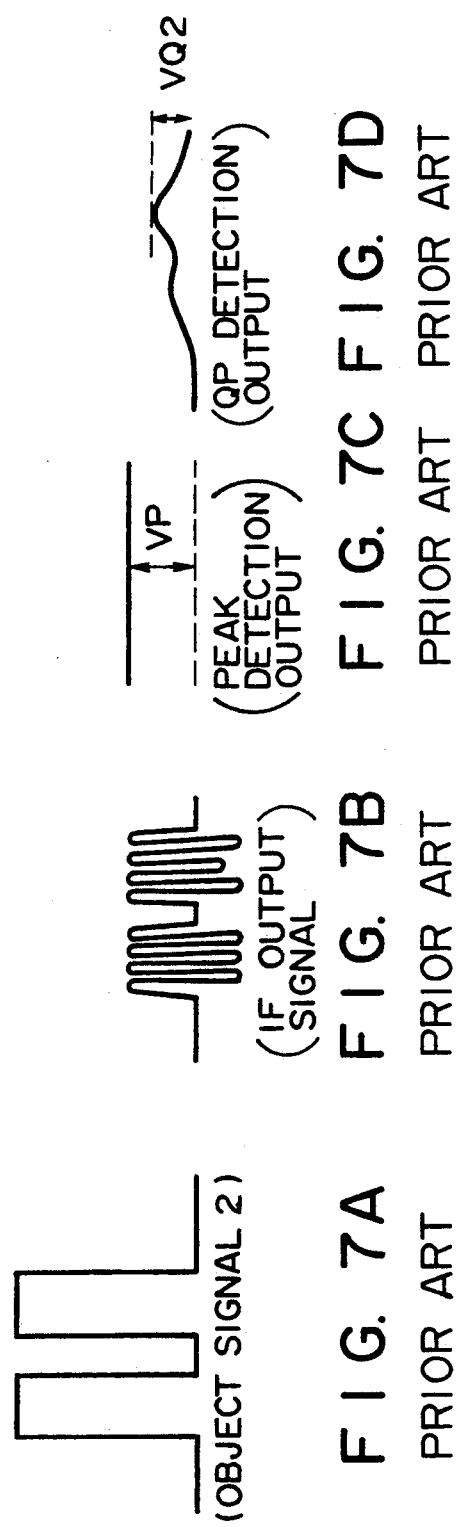

SPECTRUM ANALYZER HAVING FUNCTIONS FOR SIMULTANEOUSLY EXECUTING PLURAL KINDS OF DETECTIONS AND DISPLAYING RESULTANTS THEREOF

BACKGROUND OF THE INVENTION

1. Field of the Invention

The present invention relates generally to a spectrum analyzer which can detect spectrum values at respective frequencies of a signal to be measured ("object signal" hereinafter) and can display the detected spectrum values in two-dimensional manner, and, more particularly, to a spectrum analyzer that can be used for measuring EMI (electromagnetic interference).

2. Description of the Related Art

In general, a spectrum analyzer is used as an apparatus for examining which kind of frequency component is included in a signal having a wide frequency band, which is received by a receiver in a radio monitoring apparatus. As is well known, in this type of spectrum analyzer, spectral values (amplitudes) at respective frequencies of an object signal are displayed, for example, on a CRT display, with frequencies being set in the abscissa.

A monitoring person finds, from the spectrum characteristics displayed on a CRT display, the signal level and frequency of the peak value of the amplitude of measured frequency component, and specifies the radio intensity and frequency corresponding to the peak value. In this way, the radio intensity is found from the peak value of the amplitude of the measured frequency component.

This technique is sufficient to examine general radio intensity. However, in the case of so-called electromagnetic interference (EMI) measurement for evaluating interference radio or noise, it is necessary to determine, in advance, conditions for finding spectrum values at respective displayed frequencies. As one of these conditions, the regulations of CISPR (International Special Committee on Radio Interference) mentions the use of a QP (quasi-peak) detector circuit having QP detection characteristics. The QP detection circuit includes a kind of time-constant circuit, in order to eliminate an instantaneous peak value due to noise, etc. from the found spectrum value.

FIG. 5 shows a structure of this type of spectrum analyzer having the QP detector circuit. An object signal a input from an input terminal 1 is supplied to a mixer 2. On the other hand, a local oscillation frequency signal b is supplied from a local oscillator 3 to the mixer 2. The object signal a supplied to the mixer 2 is frequency-converted to an intermediate frequency (IF) signal c. The IF signal c is fed to a band-pass filter (BPF) 4 and its frequency band to be passed is limited. An output of the BPF 4 is supplied through a change-over switch 5a to a peak detector circuit 6 or to a QP detector circuit 7 serving as a measuring detector circuit. A signal detected by either peak detector 6 or QP detector 7 is supplied to a signal input terminal Y of a CRT display 8 through a change-over switch 5b cooperating with the change-over switch 5a, as a spectrum value signal d at a frequency designated by the local oscillator 3.

The frequency of the local oscillation frequency signal supplied from the local oscillator 3 to the mixer 2 is varied (or swept), depending on the voltage value of a sawtooth signal e output from a sawtooth signal generator 9 with a cycle T. The sawtooth signal e is also supplied, as a sweep signal, to a sweep terminal X of the CRT display 8.

The peak detector 6 does not include a time-constant circuit which is provided in the QP detector 7. Thus, the peak detector 6 outputs, as spectrum value signal d, the peak value of the IF signal fed from the BPF 4, that is, the peak value of the magnitude of the spectrum analyzed by the BPF 4.

In the spectrum analyzer having the above structure, the sawtooth signal e with constant cycle T is supplied from the sawtooth signal generator 9 to the local oscillator 3 and to the sweep terminal X of the CRT display 8. Thus, when the change-over switches 5a and 5b are connected to the peak detector 6, spectrum values corresponding to respective frequencies are displayed on the CRT display 8, as shown in FIG. 5, with the frequencies plotted in the abscissa. In other words, with the use of the peak detector 6, sharp peak waveforms 11 appear in spectrum characteristic 10, as shown in FIG. 5.

On the other hand, when the change-over switches 5a and 5b are connected to the QP detector 7, the sharp peak waveforms 11 are lessened by the time-constant circuit built in the QP detector 7.

The problems of the spectrum analyzer shown in FIG. 5 will now be described.

FIG. 6 illustrates how the peak detection output and QP detection output are different when a pulse signal is input and conventional peak detector 6 and QP detector 7 (CISPR standard) are employed. As shown in FIG. 6A, a pulse signal having a relatively small pulse width t1 is input as object signal a. In this case, a level VP of the peak detection output (shown in FIG. 6C) obtained by peak-detecting the IF output signal (shown in FIG. 6B) differs largely from a level VQ of the QP detection output (shown in FIG. 6D) which is obtained by QP-detecting the IF output signal (FIG. 6B). In contrast, when a pulse signal having a relatively large pulse width t2 is input as object signal a, as shown in FIG. 7A, a level VP of the peak detection output (FIG. 7C) obtained by peak-detecting the IF output signal (FIG. 7B) becomes substantially equal to a level VQ of the QP detection output (FIG. 7D) obtained by QP-detecting the IF output signal (FIG. 7B).

When the object signal a is measured through the mixer 2 and BPF 4, as in the spectrum analyzer shown in FIG. 5, if the object signal a is a pulse signal with small width and low frequency, the BPF 4 outputs that portion of the high frequency component of the pulse waveform, which is allowed to pass through the BPF 4, during a time period corresponding to the pulse width of the pulse waveform. Thus, the level of the signal output from the QP detector 7 becomes lower as the object signal a has smaller width and lower frequency. For this reason, a dynamic range (or an overload coefficient) required for the QP detector 7 increases. In other words, in the case of the QP detection, the output level varies in accordance with the ratio (time ratio) of time occupied by the object signal; thus, it is necessary to increase the dynamic range.

In the case of EMI measurement using a spectrum analyzer, a high frequency component fx of an object signal (basic wave f0) is often measured selectively as shown in FIG. 8.

Since the waveform of the object signal a is not predictable, it is impossible to find, in advance, a signal level Vo of the object signal a only from the QP-detected spectrum value. Thus, under the CISPR regulations, it is decided that in the case of QP detection the input signal level of the QP detector 7 is made lower than a reference level by 43.5 dB (overload coefficient), as shown in FIG. 9, in order to prevent saturation of the QP detector 7 and its peripheral circuits.

However, when the dynamic range for analysis of the QP detector 7 is, for example, only 45 dB, the actual measurement dynamic range for a pulse signal with small pulse width is reduced to 1.5 dB (excluding the overload coefficient), and the precision in measurement is lowered.

Under the circumstances, it is possible to ignore the aforementioned regulations and to increase the input signal level of the QP detector 7 by 10 dB, whereby the input signal level is set to a value lower than the reference level by 33.5 dB and the measurement dynamic range for the pulse signal is increased to 11.5 dB.

In this case, however, the pulse signal with small pulse width is input and it is difficult to check whether or not the QP detector 7 is saturated.

This being the case, it may be thought that, as shown in FIG. 5, the peak detector 6 is provided in addition to the QP detector 7 serving as the measurement detector. First, the spectrum characteristic 10 is displayed on the CRT display 8 by using the peak detector 6, thereby confirming that no saturation occurs at a tip portion of each peak waveform 11. Thereafter, the change-over switches 5a and 5b are connected the QP detector 7 to perform regular measurement.

However, when the detectors 6 and 7 are changed over by means of change-over switches 5a and 5b, the measurement signal of the spectrum value obtained by the peak detector 6 and the measurement signal of the spectrum value obtained by the QP detector 7 are not considered to be identical, in strict sense, because there is a time difference therebetween. It is, therefore, impossible to confirm that the measurement signal corresponding to each spectrum value detected by the QP detector is not actually saturated in the QP detector.

It should be noted that in this specification the term "spectrum value" means not a frequency value but an amplitude value of a spectrum having a given frequency.

In brief, in the conventional spectrum analyzer, the EMI measurement is carried out by using the QP detector. The QP detector, however, has only a dynamic range of 45 dB, despite the fact that it is necessary to set a reference level to a value higher than the received signal by 43.5 dB corresponding to an overload coefficient (a margin for a pulse input signal). Because of this, a substantial dynamic range is only 1.5 dB, and it is difficult to perform a wide-band measurement with use of the same reference level. In addition, in the case of a narrow-band measurement, the QP measurement can be performed, only after the received level of the received signal is precisely measured, and the reference level is set within 1.5 dB. Consequently, it is difficult to precisely measure signals having low repeatability.

SUMMARY OF THE INVENTION

It is, therefore, an object of the present invention to provide a new and improved spectrum analyzer having functions for simultaneously executing a plural kinds of detections and displaying resultants thereof. According to this spectrum analyzer, an object signal is simultaneously detected by a measurement detector circuit and a peak detector circuit, and corresponding spectrum values are simultaneously displayed. Thus, while the measurement detector performs detection, it can be exactly confirmed that the object signal is not saturated in the measurement detector. Further, a measurement dynamic range can be widened, measurement precision can be enhanced, and reliability of measured values can be increased.

Another object of the present invention is to provide a spectrum analyzer wherein an alarm device for indicating the fact that a spectrum value of the peak detector has exceeded a predetermined allowable limit value, whereby the occurrence of saturation in the measurement detector can be surely confirmed, and reliability of measured values can be increased.

According to one aspect of the present invention, there is provided a spectrum analyzer comprising:

frequency conversion means for sweeping an object signal within a desired measurement frequency range, thereby frequency-converting the object signal;

peak detection means for detecting a peak of an output from the frequency converting means;

measurement detection means for measuring and detecting the output from the frequency conversion means simultaneously with the peak detection by the peak detection means, said measurement detection means having an output characteristic lower than an output characteristic of the peak detection means; and display means for displaying an output from the peak detection means and an output from the measurement detection means on a single display screen, in synchronism with the sweeping by the frequency conversion means, with these outputs of the peak detection means and the measurement detection means being plotted along an axis representative of frequencies.

According to another aspect of the invention, there is provided a spectrum analyzer comprising:

frequency conversion means for sweeping an object signal within a desired measurement frequency range, thereby frequency-converting the object signal;

peak detection means for detecting a peak of an output from the frequency converting means;

measurement detection means for measuring and detecting the output from the frequency conversion means simultaneously with the peak detection by the peak detection means, said measurement detection means having an output characteristic lower than an output characteristic of the peak detection means;

display means for displaying at least an output from the measurement detection means in synchronism with the sweeping by the frequency conversion means, with the output of the measurement detection means being plotted along an axis representative of frequencies; and alarm means indicating the fact that an output from the peak detection means has exceeded a predetermined allowable limit level.

In the spectrum analyzer having the above structure, the object signal is detected simultaneously by the peak detector and the measurement detector, and corresponding spectrum values are obtained and simultaneously displayed. Thus, when the spectrum value output from the peak detector exceeds an allowable value, it can be instantaneously found that the object signal is saturated in the measurement detector.

Also, in the spectrum analyzer according to another mode, the spectrum value of the peak detector is not displayed simultaneously with the spectrum value of the measurement detector, though these spectrum values are measured simultaneously. However, when the spectrum value of the peak detector exceeds an allowable limit value, an alarm device indicates this fact. Thus, the occurrence of saturation in the measurement detector can be confirmed by virtue of the alarm device.

Additional objects and advantages of the invention will be set forth in the description which follows, and in part will be obvious from the description, or may be learnt by practice. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiment given below, serve to explain the principles of the invention.

FIG. 1B is a flowchart for explaining the operation of the spectrum analyzer shown in FIG. 1A;

FIG. 3 is a block diagram showing a schematic structure of a spectrum analyzer according to a third embodiment of the invention;

FIGS. 4A and 4B are block diagrams showing, in particular, displays according other embodiments of the invention;

FIGS. 6A to 6D and FIGS. 7A to 7D illustrate the relationship between the waveforms of object signals and the waveforms of detection signals;

DETAILED DESCRIPTION OF THE PREFERRED EMBODIMENTS

Embodiments of the present invention will now be described with reference to the accompanying drawings.

Figure 1A:
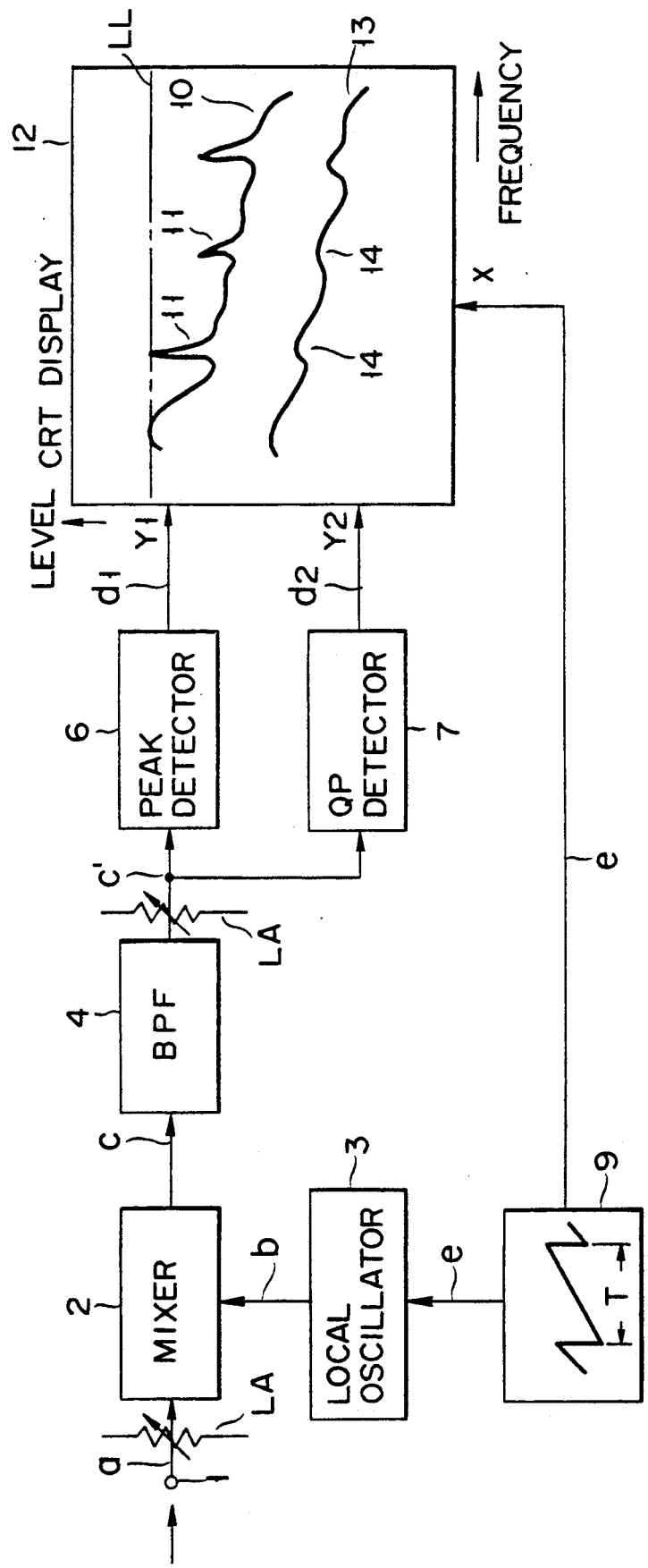
FIG. 1A is a block diagram showing a schematic structure of a spectrum analyzer according to a first embodiment of the present invention.
Figure 5:
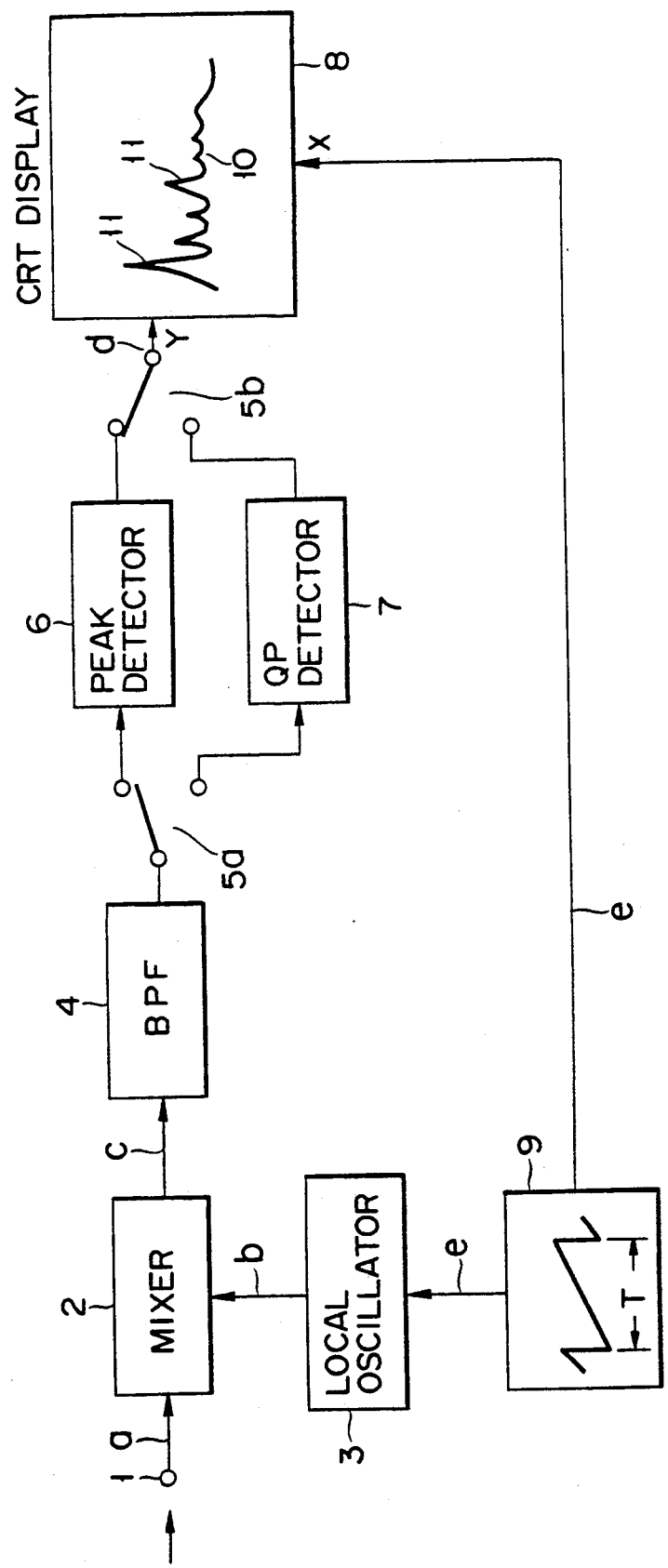
FIG. 5 is a block diagram showing a conventional spectrum analyzer.
Figure 8:
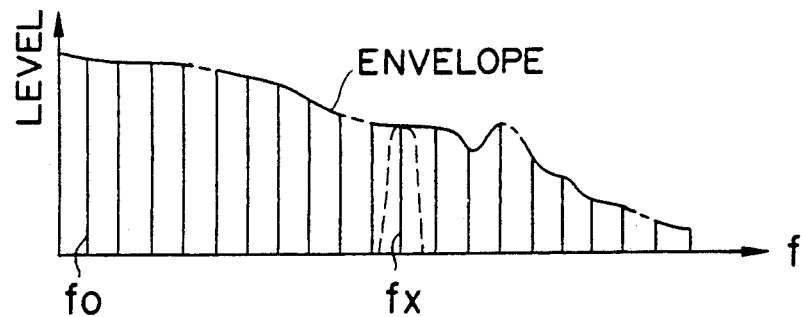
FIG. 8 shows the relationship between an object signal (basic wave) and a high frequency component in EMI measurement.
Figure 9:
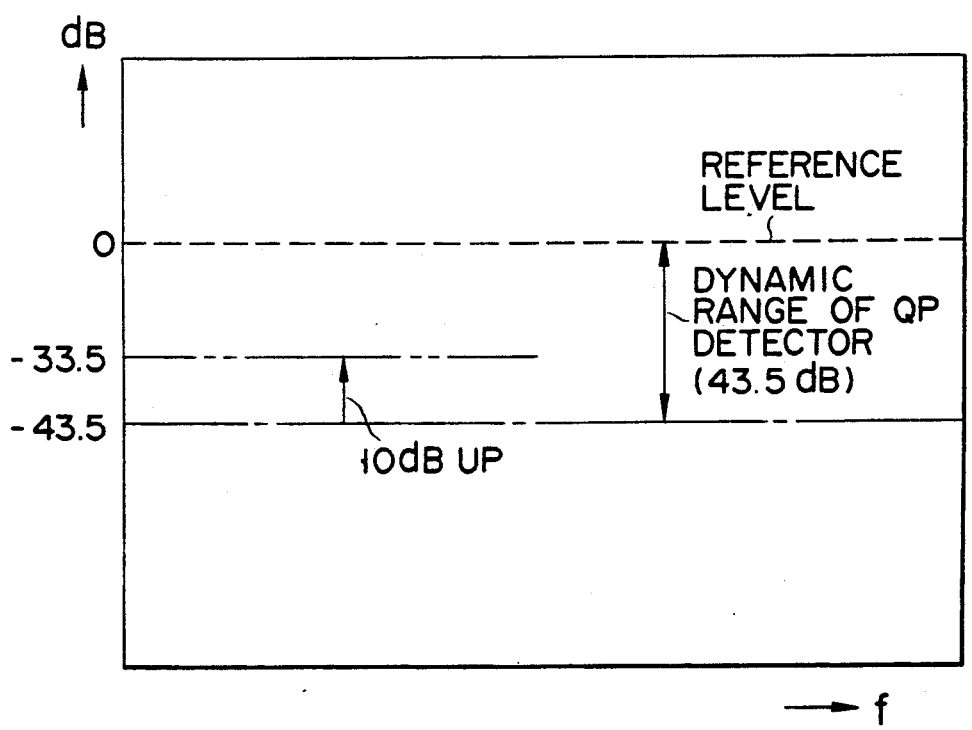
FIG. 9 is a view for explaining a problem of a conventional spectrum analyzer.

FIG. 1A is a block diagram schematically showing a spectrum analyzer according to a first embodiment of the present invention. In FIG. 1A, the structural elements that are shown in FIG. 5 are denoted by the same reference numerals. The spectrum analyzer shown in FIG. 1A comprises a mixer 2, a local oscillator 3, a BPF (band-pass filter) 4, a peak detector circuit 6, a QP detector circuit 7 serving as a measuring detector circuit, a CRT display 12 serving as display means, and a sawtooth signal generator 9.

An object signal a is input to the mixer 2 through the input terminal 1. The mixer 2 receives a local oscillation frequency signal b fed from the local oscillator 3, thereby frequency-converting the object signal a. The frequency-converted object signal a is fed to the BPF 4 as an intermediate frequency (IF) signal c. The BPF 4 limits the passing frequency band of the IF signal c output from the mixer 2, thus enhancing frequency resolution. The peak value of an IF signal c′ output from the BPF 4, the passing frequency band of which has been limited, is detected by the peak detector 6. The detected peak value is supplied, as a peak spectrum signal d1, to a first input terminal Y1 of the CRT display 12. Simultaneously, the IF signal c′ is QP-detected by the QP detector 7 serving as the measurement detector circuit having the time-constant circuit. The QP-detected signal is output from the QP detector 7, as a measurement spectrum signal d2, to a second input terminal Y2 of the CRT display 12.

The input signal level of the peak detector 6 and the input signal level of the QP detector 7 are set to the same value.

The CRT display 12 is constituted by, for example, a two-channel chopping type oscilloscope with a relatively long afterglow time. The spectrum value signals d1 and d2 input to the first and second input terminals Y1 and Y2 are chopped with a predetermined frequency and are displayed alternately. A sweep terminal X of the CRT display 12 receives a sawtooth signal e as a sweep signal with a cycle T, which is output from the sawtooth signal generator 9. Accordingly, the peak spectrum value signal d1 output from the peak detector 6 and the measurement spectrum value signal d1 output from the QP detector 7 are displayed on the CRT display 12 in a multi-channel mode, with the frequencies being plotted in the abscissa. A spectrum characteristic 10 corresponding to the peak spectrum value signal d1 includes a number of sharp peak waveforms 11, whereas a spectrum characteristic 13 corresponding to the measurement spectrum value signal d2 includes peak waveforms 14 which are less sharp than the peak waveforms 11.

According to the above-described spectrum analyzer, the object signal a input from the input terminal 1 is detected by the QP detector 7 to form the measurement spectrum value signal d2 and is simultaneously detected by the peak detector 6 to form the peak spectrum value signal d1, as illustrated in the flowchart shown in FIG. 1B. The spectrum characteristics 13 and 10, both corresponding to the spectrum value signals d2 and d, are displayed on the same screen (step S1).

Then, in step S2, when it is confirmed that one of the peak waveforms 11 of the spectrum characteristic 10 corresponding to the peak detector 6 exceeds a predetermined limit value (LL) or a tip portion of the peak waveform 11 is flattened and saturated, the IF signal c′ corresponding to the object signal a is found to be saturated in the QP detector 7, even if no saturation phenomenon appears in the peak waveforms 14 of the spectrum characteristic 13 corresponding to the QP detector 7.

When the saturation of the IF signal c′ is confirmed, the level of the input to the QP detector 7 and the peak detector 6 is lowered by a level adjusting circuit LA such as an attenuator or an amplifier, which is arranged in front of or in rear of the mixer 2 (step S3).

On the other hand, when no saturation phenomenon appears in the spectrum characteristic 10 corresponding to the peak detector 6, it can be confirmed that no saturation phenomenon occurs in the QP detector 7.

In other words, since it can be exactly checked whether or not the QP detector 7 is saturated, the input signal level of the QP detector 7 can be increased, along with the input signal level of the peak detector 6, by the level adjusting circuit LA, up to a limit value where no saturation phenomenon appears in the spectrum characteristic 10. Thus, the spectrum value can be measured in the QP detector 7 with the widest possible dynamic range (step S4). Accordingly, the measurement precision of the spectrum values of the spectrum analyzer can be enhanced.

Figure 2:
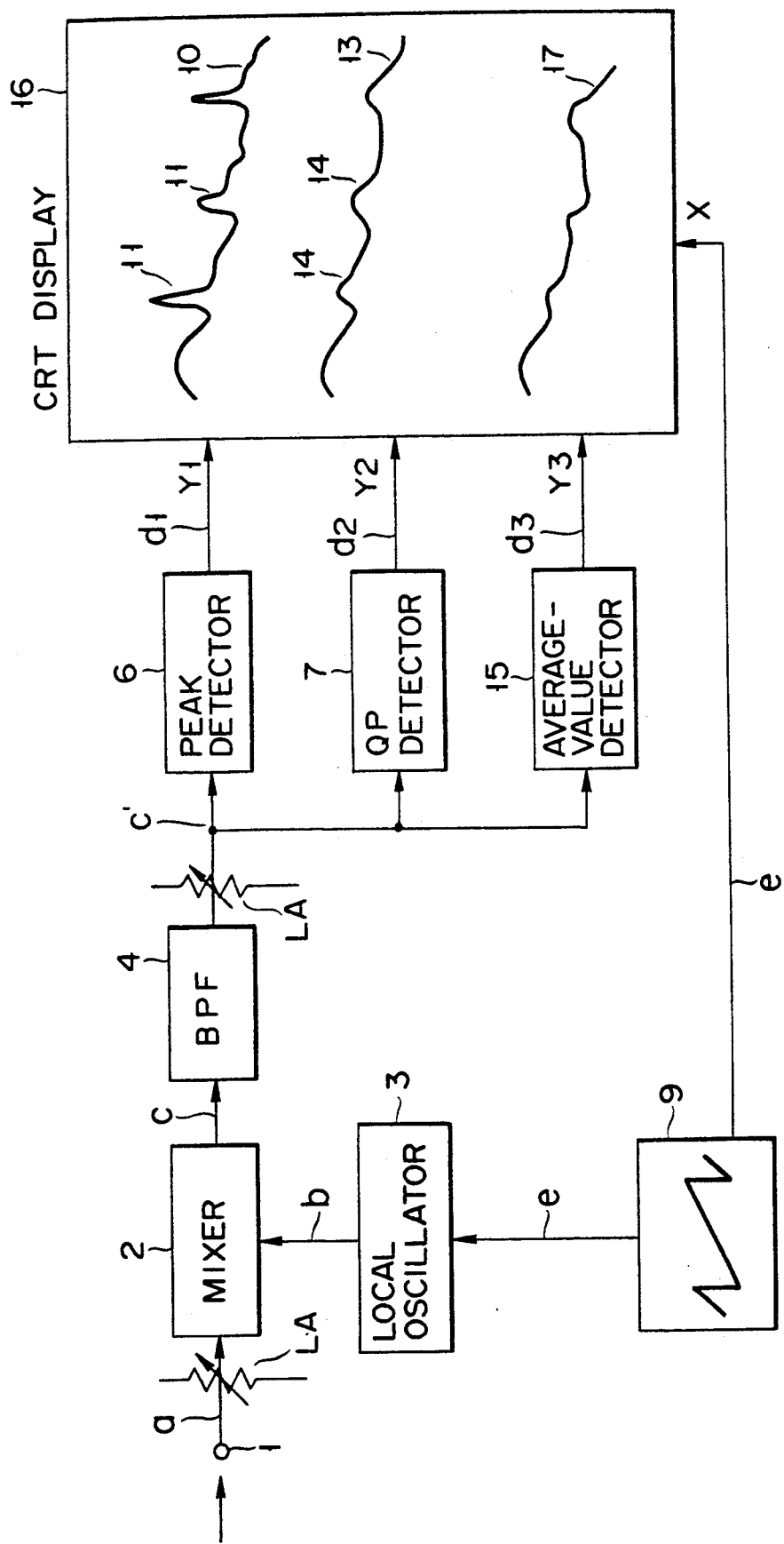
FIG. 2 is a block diagram showing a schematic structure of a spectrum analyzer according to a second embodiment of the invention.

FIG. 2 is a block diagram showing a spectrum analyzer according to a second embodiment of the present invention. In FIG. 2, the structural elements that are shown in FIG. 1 are denoted by the same reference numerals.

In the second embodiment, the measurement detector circuit includes not only the QP detector 7, shown in FIG. 1A, but also an average-value detector circuit 15 for outputting an average value of an input signal in a predetermined time period. Also, a CRT display 16 is constituted by a three-channel chopping type oscilloscope. The IF signal c' output from the BPF 4 is supplied to the peak detector 6, the QP detector 7 and the average-value detector 15 simultaneously and in parallel manner. Spectrum value signals d1, d2 and d3 are output from the detectors 6, 7 and 15 to input terminals Y1, Y2 and Y3 of the CRT display 16. The CRT display 16 displays simultaneously the spectrum characteristic 10 corresponding to the peak detector 6, the spectrum characteristic 13 corresponding to the QP detector 7, and a spectrum characteristic 17 corresponding to the average-value detector 15.

As shown in FIG. 2, in the spectrum characteristic 17 of the average-value detector 15, the level of a pulse signal with low frequency and small pulse width is attenuated by an averaging process. Also, regarding the spectrum characteristic 17, the saturation phenomenon of the peak waveforms 11 of the spectrum characteristic 10 corresponding to the peak detector 6 can be monitored and the level of the input to the average-value detector 15 can be adjusted by the level adjusting circuit LA, whereby the occurrence of the saturation phenomenon in the average-value detector 15 can be surely prevented. Thus, substantially the same effects as in the first embodiment shown in FIG. 1A can be brought about.

Of course, it is possible to remove the QP detector 7 and to use only the average-value detector 15 as the measurement detector circuit.

Figure 4A:
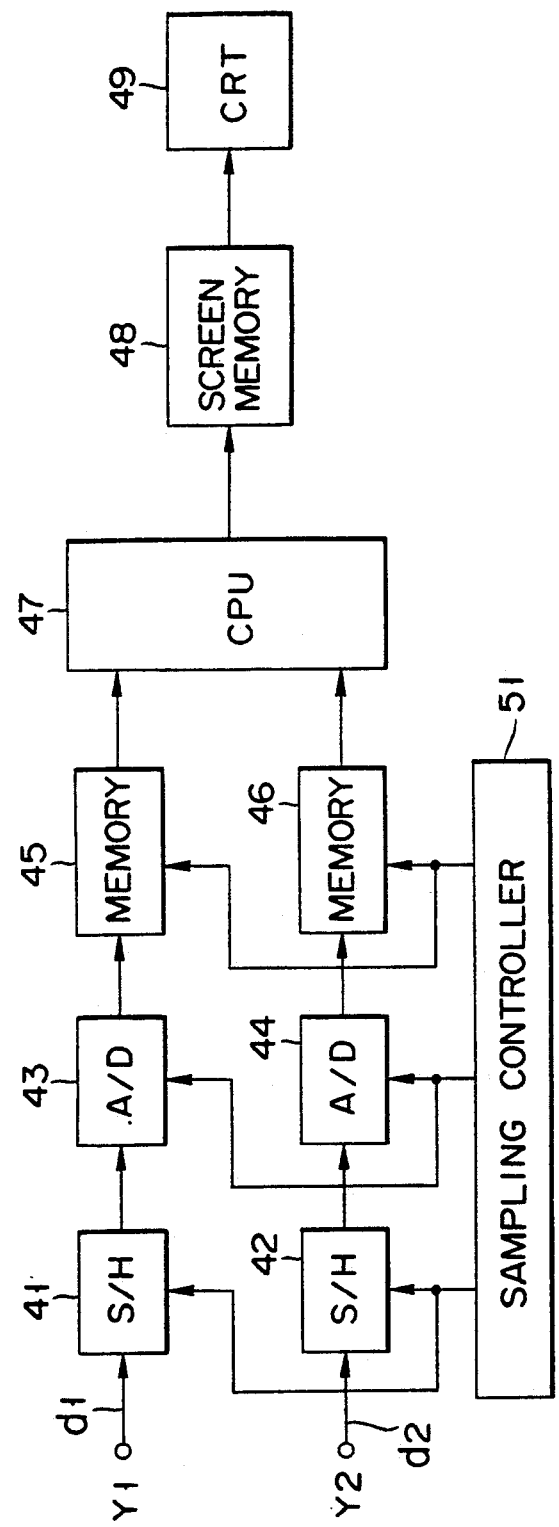

Furthermore, digital oscilloscopes as shown in FIG. 4A and 4B may be used in place of the CRT displays 12 and 16 shown in FIG. 1A and FIG. 2 which are constituted by two-channel/three-channel chopping type oscilloscopes. In FIG. 4A, input spectrum value signals d1 and d2 are stored in memories 45 and 46 through sample/hold (S/H) circuits 41 a sampling controller 51. The digital spectrum values stored in the memories 45 and 46 are compiled by a CPU 47 and are transmitted to a screen memory 48. Then, the data in the screen memory 48 is displayed on a CRT 49. In FIG. 4B, input spectrum value signals d1 and d2 are supplied to a multiplexer 40 through S/H circuits 41 and 42, and are alternately supplied to an A/D converter 50. In this respect, the structure of FIG. 4B differs from that of FIG. 4A.

FIG. 3 is a block diagram showing a spectrum analyzer according to a third embodiment of the present invention. In FIG. 3, the structural elements that appear in FIG. 1A are denoted by the same reference numerals.

In the third embodiment, a CRT display 18 is constituted by a one-channel oscilloscope. A measurement spectrum value signal output from the QP detector serving as the measurement detector circuit is input to a signal input terminal Y of the one-channel CRT display 18. The CRT display 18 displays only a spectrum characteristic 13 corresponding to the QP detector 7.

On the other hand, a peak spectrum value signal d1 output from the peak detector 6 is input to a level detector circuit 19. The level detector 19 turns on an alarm lamp 20 when the peak spectrum value signal d1 exceeds a predetermined allowable limit level.

In the third embodiment, the level of the input to the peak detector 6 is equal to that to the QP detector 7.

While a monitoring person observes the spectrum characteristic 13 corresponding to the QP detector 7 displayed on the CRT display 18, he can immediately know the occurrence of saturation in the peak detector 6 and QP detector 7 once the alarm lamp 20 is turned on. Thus, substantially the same effects as the above-described embodiments can be obtained.

Further, in the third embodiment, since the one-channel CRT display 18 is used, the manufacturing cost can be reduced, compared to the first and second embodiments.

Moreover, when the object signal is measured by different types of measurement detector circuits for various purposes of evaluation, these circuits have different detection efficiencies and overload coefficients. Thus, if these circuits are connected in one signal line, the saturation of the signal line and each detector circuit becomes a serious problem. In the present invention, the saturation can be checked, on the basis of the peak value detected by the peak detector.

In the above description, the terms "peak value", "QP value", and "average value" mean, respectively, the peak value, QP value, and average value of the amplitude of the measured frequency component, and not the peak value, QP value and average value of the data obtained in one sweep measurement. In particular, since the QP value and average value are concerned with time, the sweep time should be slow to such a degree that no influence is exerted on the time for finding the QP value and average value.

As has been described above in detail, the spectrum analyzer of the present invention detects the object signal simultaneously by means of the measurement detector circuit and the peak detector circuit, and displays the resultant spectrum values o the display. Thus, while monitoring the spectrum value corresponding to the peak detector, a monitoring person can exactly confirm that the object signal is not saturated in the measurement detector when the object signal is detected by the measurement detector. Therefore, the measuring dynamic range of the measurement detector can be widened, the measurement precision can be enhanced, and the reliability of the measurement values can be increased.

Furthermore, since the alarm device is provided for indicating that the spectrum value of the peak detector has exceeded an allowable limit value, the occurrence of saturation in the measurement detector can be confirmed, and the reliability in measurement values can be increased.

In brief, according to the EMI measurement using the spectrum analyzer of the present invention, the QP detection can be carried out, even if the overload coefficient of 43.5 dB is not necessarily provided to the QP detector. In addition, by using the means for surely attaining the resultants of the QP detection, the wideband EMI measurement can be performed at high speed and exactly.

Namely, in the present invention, consideration has been given to the fact that the occurrence of overload of 43.5 dB is rare in the EMI measurement. When the QP detection is performed in a margin (e.g., 33.5 dB) lower than this value and no overload occurs, the measurement results obtained in this case are judged to be valid. More specifically, in the spectrum analyzer, the QP detection and the peak detection are simultaneously performed, and the resultants thereof are displayed on the two-channel display in the simultaneous sweep mode. Thus, the load condition (peak value) during the measurement and the QP detection resultants are monitored while these are compared with each other.

Additional embodiments of present invention will be apparent to those skilled in the art from consideration of the specification and practice of the present invention disclosed therein. It is intended that the specification and examples be considered as exemplary only, with the true scope of the present invention being indicated by the following claims.

What is claimed is:

1. A spectrum analyzer comprising:
    frequency conversion means for sweeping an object signal within a desired measurement frequency range, and for thereby frequency-converting the object signal into a frequency conversion output signal corresponding to a measured frequency component, said frequency conversion means having an input signal and an output side;
    directing means for directing the frequency conversion output signal from the frequency conversion means simultaneously to at lest a first path and a second path;
    peak detection means for detecting a peak of an amplitude of the frequency conversion output signal directed to the first path by the directing means, said peak detection means producing a peak detection output signal representative of the thus detected peak amplitude;
    measurement detection means for, substantially simultaneously with a peak detection operation of the peak detection means, detecting at least one of a quasi-peak value and an average value of an amplitude of the frequency conversion output signal directed to the second path by the directing means, said measurement detection means producing a measurement detection output signal representative of the thus detected one of the quasi-peak value and the average value of the amplitude of the frequency conversion output signal;
    display means for substantially simultaneously displaying the peak detection output signal from the peak detection means and the measurement detection output signal from the measurement detection means on a single display screen substantially in synchronization with the frequency conversion means sweeping of said object signal;
    said peak detection output signal from the peak detection means and the measurement detection output signal from the measurement detection means being displayed on said display screen along an axis representative of frequencies; and
    level adjusting means, provided on at least one of the input side and the output side of the frequency conversion means, for adjusting one of the object signal and the frequency conversion output signal to prevent saturation of the measurement detection output signal, based on monitored values of the peak detection output signal, displayed on the single display screen of the display means together with the measurement detection output signal.

2. The spectrum analyzer according to claim 1, wherein said display means further comprises:
    analog-display means for displaying the peak detection output signal from the peak detection means and the measurement detection output signal from the measurement detection means in analog form.

3. The spectrum analyzer according to claim 2, wherein said analog-display means includes a multichannel chopping display type oscilloscope.

4. The spectrum analyzer according to claim 1, wherein said display means further comprises;
    digital display means for digitally displaying the peak detection output from the peak detection means and the measurement detection output signal from the measurement detection means.

5. The spectrum analyzer according to claim 4, wherein said digital-display means includes a digital oscilloscope.

6. The spectrum analyzer according to claim 1, wherein said measurement detection means further comprises:
    quasi-peak value detecting means for detecting the quasi-peak value; and
    said quasi-peak value detection means having a preselected dynamic range within a margin less than a predetermined overload coefficient when the analyzer is to be used for measuring electromagnetic interference.

7. The spectrum analyzer according to claim 6, further comprising:
    monitoring means for monitoring the output from the quasi-peak detection means displayed on the display means; and
    the level adjusting means adjusting the output of said quasi-peak adjusting means having said preselected dynamic range, to prevent saturation thereof, based on the monitored values of the output from said quasi-peak detection means displayed on said display means.

8. A spectrum analyzer comprising:
    frequency conversion means for sweeping an object signal within a desired measurement frequency range, and for thereby frequency-converting the object signal into a frequency conversion output signal corresponding to a measured frequency component, said frequency conversion means having an input side and an output side;
    directing means for directing the frequency conversion output signal from the frequency conversion means simultaneously to at least a first path and a second path;
    peak detection means for detecting a peak of an amplitude of the frequency conversion output signal directed to the first path by the directing means, said peak detection means producing a peak detection output signal representative of the thus detected peak amplitude;
    measurement detection means for, substantially simultaneously with a peak detection operation of the peak detecting means, detecting at least one of a quasi-peak value and an average value of an amplitude of the frequency conversion output signal directed to the second path by the directing means, said measurement detection means producing a measurement detection output signal representative of the thus detected one of the quasi-peak value and the average value of the amplitude of the frequency conversion output signal;

display means for substantially simultaneously displaying the peak detection output signal from the peak detection means and the measurement detection output signal from the measurement detection means on a single display screen substantially in synchronization with the frequency conversion means sweeping of said object signal;

said peak detection output signal from the peak detection means and the measurement detection output signal from the measurement detection means being displayed on said display screen along an axis representative of frequencies;

level adjusting means, provided on at least one of the input side and the output side of the frequency conversion means, for adjusting one of the object signal and the frequency conversion output signal to prevent saturation of the measurement detection output signal, based on monitored values of the peak detection output signal displayed on the single display screen of the display means together with the measurement detection output signal; and alarm means for indicating that the peak detection output signal from the peak detection means has exceeded a predetermined allowable limit level.

9. The spectrum analyzer according to claim 8, wherein said alarm means includes an alarm lamp.

10. A spectrum analyzing method comprising the steps of:

sweeping an object signal within a desired measurement frequency range, and for thereby frequency-converting the object signal into a frequency conversion output signal corresponding to a measured frequency component;

directing said frequency conversion output signal simultaneously to at least a first path and a second path;

peak-detecting a value of an amplitude of the frequency conversion output signal directed to the first path and providing a peak detection output signal representative of the thus detected peak value;

measurement-detecting at least one of a quasi-peak value and an average value of an amplitude of the frequency conversion output signal directed to the second path, substantially simultaneously with the peak detection step, and producing a measurement detection output signal representative of the thus detected one of the quasi-peak value and the average value of the amplitude;

simultaneously displaying on a single display screen along an axis representative of frequencies the peak detection output signal obtained as the result of the peak detection step and the measurement detection output signal obtained as the result of the measurement-detection step, in synchronization with the sweeping of the object signal in the sweeping step; and adjusting one of the object signal and the frequency conversion output signal to prevent saturation of the measurement detection output signal, based on monitored values of the peak detection output signal on the single display screen.

11. The method according to claim 10 wherein the peak detection output signal and the measurement detection output signal are displayed simultaneously in analog form.

12. The method according to claim 10 wherein the peak detection output signal and the measurement detection output signal are displayed simultaneously in digital form.

* * * * *